United States Patent [19]

Vasquez et al.

[11] Patent Number: 4,994,406
[45] Date of Patent: Feb. 19, 1991

[54] METHOD OF FABRICATING SEMICONDUCTOR DEVICES HAVING DEEP AND SHALLOW ISOLATION STRUCTURES

[75] Inventors: Barbara Vasquez, Chandler; Peter J. Zoebel, Mesa, both of Ariz.

[73] Assignee: Motorola Inc., Schaumburg, Ill.

[21] Appl. No.: 431,420

[22] Filed: Nov. 3, 1989

[51] Int. Cl.⁵ .......................................... H01L 21/467
[52] U.S. Cl. ...................................... 437/67; 156/644; 156/649
[58] Field of Search .................. 437/67; 156/644, 649

[56] References Cited

U.S. PATENT DOCUMENTS

| | | | |
|---|---|---|---|
| 4,630,356 | 12/1986 | Christie et al. | 437/69 |
| 4,636,281 | 1/1987 | Buiquez | 437/67 |
| 4,853,344 | 8/1989 | Darmawan | 437/67 |

FOREIGN PATENT DOCUMENTS

| | | | |
|---|---|---|---|
| 0190040 | 11/1983 | Japan | 437/67 |
| 0136327 | 7/1985 | Japan | 437/67 |
| 0211958 | 10/1985 | Japan | 437/67 |
| 0154144 | 7/1986 | Japan | 437/67 |
| 0249448 | 10/1987 | Japan | 437/67 |
| 0144540 | 6/1988 | Japan | 437/67 |

Primary Examiner—Olik Chaudhuri
Assistant Examiner—Ourmazd S. Ojan
Attorney, Agent, or Firm—Harry A. Wolin

[57] ABSTRACT

A method of fabricating a semiconductor structure includes forming a thermal oxide layer, a polysilicon layer and a first dielectric layer on a substrate and using a mask to form at least one opening therein. Dielectric spacers are then formed in the opening and a trench having a self-aligned reduction in width due to the dielectric spacers is etched into the substrate beneath the opening. A dielectric trench liner is then formed prior to filling the trench with polysilicon. A second mask is then used to form isolation element openings in the first dielectric layer in which shallow isolation elements are formed.

16 Claims, 6 Drawing Sheets

METHOD OF FABRICATING SEMICONDUCTOR DEVICES HAVING DEEP AND SHALLOW ISOLATION STRUCTURES

BACKGROUND OF THE INVENTION

This invention relates, in general, to semiconductor devices, and more particularly to a method of fabricating a semiconductor structure that is compatible with multiple technologies.

In the semiconductor art, a trend is toward the fabrication of device structures that are compatible with multiple technologies. For example, structures allowing for the implementation of both bipolar and MOS devices in a single integrated circuit are highly desirable because the best characteristics of both technologies may be obtained. This allows for the fabrication of CMOS and BIMOS high performance integrated circuits. For fabrication methods of multiple technology integrated circuits to become practical, process integration flexibility must be obtained. Additionally, it is desirable to be able to develop methods of fabrication having enhanced scalability characteristics.

Prior art methods of fabricating semiconductor structures having variable width shallow isolation elements, especially those disposed over deep trench isolation elements generally require multiple masking steps. Specifically, masks are used to define the encroachment of the isolation elements into the active regions. Inherent with multiple masking steps are misalignment tolerances that must be provided for. These misalignment tolerances prohibit aggressive scaling of structures and require additional real estate.

In view of the above, it would be highly desirable to have a method of fabricating semiconductor structures having variable width shallow isolation elements self-aligned to deep trench isolation elements.

SUMMARY OF THE INVENTION

Accordingly, it is an object of the present invention to provide a method of fabricating a semiconductor structure that is compatible with several technologies.

One more object of the present invention is to provide a method of fabricating a semiconductor structure having increased integration flexibility.

Another object of the present invention is to provide a method of fabricating a semiconductor structure having enhanced scalability characteristics.

It is an additional object of the present invention to provide a method of fabricating a semiconductor structure wherein both deep trench isolation elements and shallow dielectric isolation elements may be fabricated at variable widths.

Yet a further object of the present invention is to provide a method of fabricating a semiconductor structure that may be employed in conjunction with high performance integrated circuits.

The foregoing and other objects and advantages are achieved in the present invention by one embodiment in which, as a part thereof, includes providing a semiconductor substrate and forming a thermal oxide layer, a polysilicon layer and a first dielectric layer thereon. A first mask is formed on the first dielectric layer and is used to form at least one opening therein that extends to the polysilicon layer. Dielectric spacers are then formed in the opening to allow for a self-aligned reduction in width of a trench formed in the substrate beneath the opening. After forming a dielectric trench liner in the trench, the trench is filled and the dielectric spacers can be removed to expose the portions of the polysilicon layer disposed beneath. The removal of the dielectric spacers creates a self-aligned offset between the trench liner and the edge of the first dielectric layer which will serve as a mask for the formation of shallow dielectric isolation elements. A second mask is then employed and allows for the selective removal of the first dielectric layer in areas where it was not earlier removed during the formation of the openings. Shallow isolation elements are then formed in the areas where the first dielectric layer has been removed.

A more complete understanding of the present invention can be attained by considering the following detailed description in conjunction with the accompanying drawings.

DETAILED DESCRIPTION OF THE INVENTION

Figure 1:
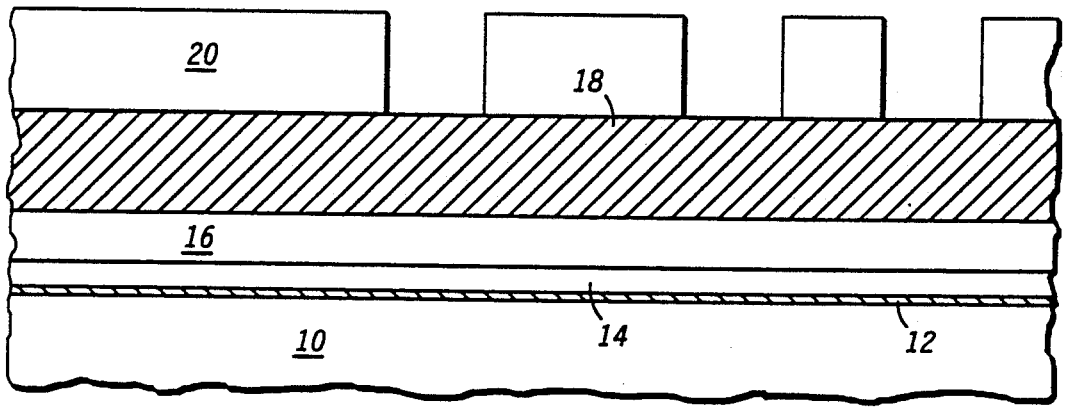
FIGS. 1-16 are highly enlarged cross-sectional views of a portion of a semiconductor structure during processing.

FIGS. 1-16 are highly enlarged cross-sectional views of a portion of a semiconductor structure during processing. It should be understood that the figures herein may not be precisely to scale. Initially, a substrate 10 is provided. In this embodiment, substrate 10 is comprised of monocrystalline silicon however it should be understood that substrates comprising other materials may be used. Depending upon the device application, substrate 10 may comprise semiconductor material wherein pre-isolation processing has been completed to establish required doping profiles and epitaxial layers. A thin thermal oxide layer 12 is formed on substrate 10 followed by the formation of a thin polysilicon layer 14 thereon, preferably by deposition. As one skilled in the art will understand, polysilicon layer 14 will serve as a buffer for the local oxidation which will be explained presently. A nitride layer 16 is formed on polysilicon layer 14. Nitride layer 16 is formed by CVD in this embodiment although other well known methods may be employed. An oxide layer 18 is then formed, preferably by CVD, on nitride layer 16.

Figure 2:
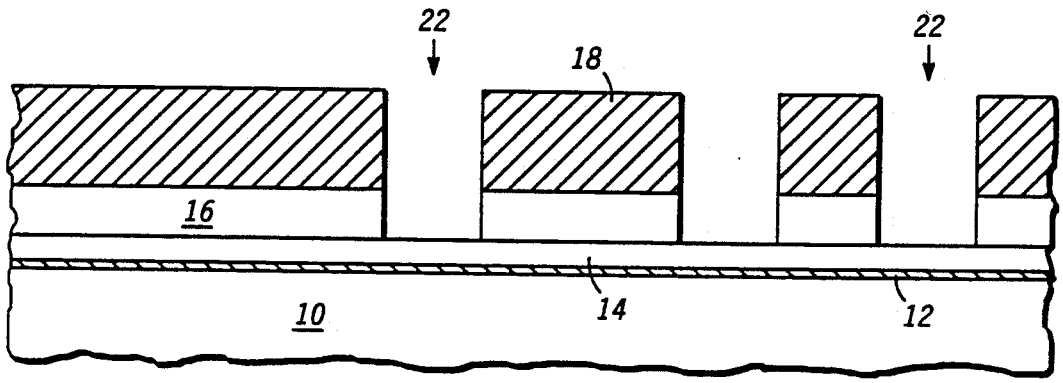

Following the formation of oxide layer 18, a photoresist mask 20 is formed thereon. The formation of photoresist mask 20 includes patterning a photoresist layer by methods well known in the art. Mask 20 is employed to form openings 22 that extend through oxide layer 18 and nitride layer 16 and stop on polysilicon layer 14 as shown in FIG. 2. Openings 22 are formed by reactive ion etching. Once openings 22 have been formed, photoresist mask 20 is removed by a standard photoresist clean.

Figure 3:
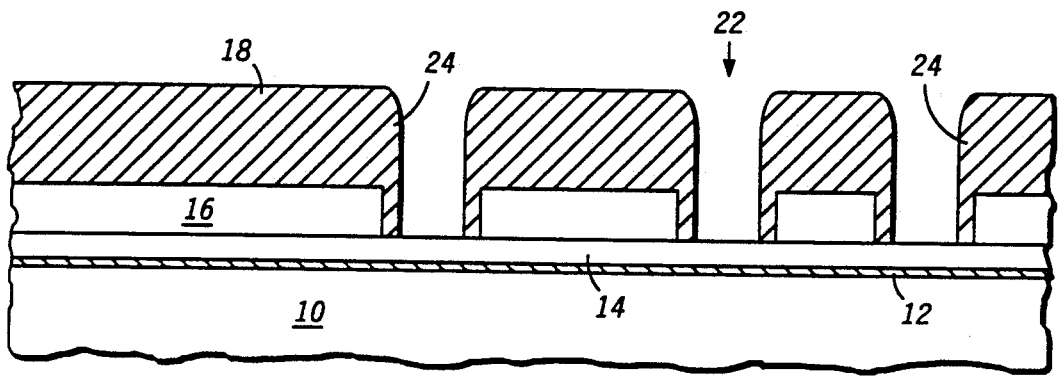

As shown in FIG. 3, dielectric spacers 24 are formed in openings 22. Spacers 24 are comprised of oxide in this embodiment although nitride or oxynitride may be employed. Oxide spacers 24 are formed by depositing, either by CVD or PECVD, an oxide layer (not shown) and then reactive ion etching the oxide layer to form oxide spacers 24. It should be understood that this oxide spacer etch stops on polysilicon layer 14. Spacers 24 allow for a self-aligned reduction in the widths of openings 22. It should be understood that the use of spacers 24 allows openings 22 to be reduced to widths smaller than those obtainable using conventional photolithography techniques. Further, the width of spacers 24 may be varied according to the application. This enhances scalability characteristics of the structure.

Figure 4:
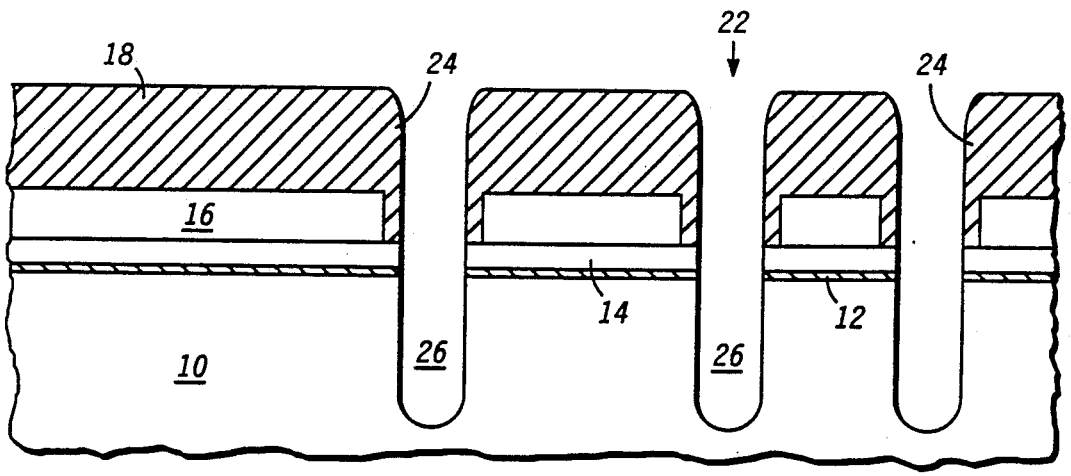
Figure 5:
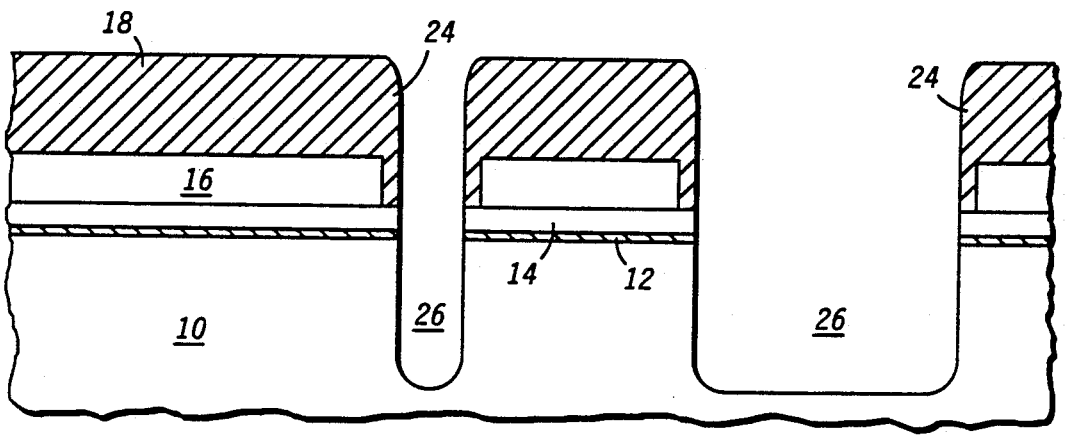

FIG. 4 illustrates the formation of trenches 26 beneath openings 22. Reactive ion etching is employed to form trenches 26. As shown, trenches 26 extend into substrate 10. The width of trenches 26 is determined by the width of the corresponding opening 22 and spacers 24 disposed therein. Although FIGS. 1–4 show a series of trenches 26 of approximately the same width, it should be understood that the present invention may be employed in structures having trenches 26 of varying widths as shown in FIG. 5.

Figure 6:
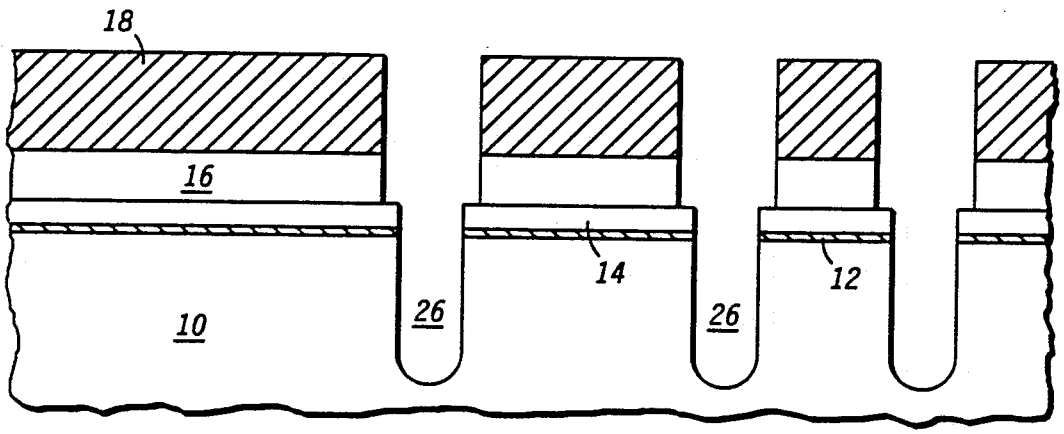

As shown in FIG. 6, a trench clean is performed following the formation of trenches 26. In this embodiment, a dilute solution of hydrofluoric acid is employed to remove sidewall passivation material left in trenches 26 by the reactive ion etch. The trench clean can also be employed to remove oxide spacers 24. Although spacers 24 are shown to be completely removed in this embodiment, partial removal thereof is also possible. The width of spacers 24 to be removed is dependent upon the clean and application for which the structure will be employed.

The removal of spacers 24 exposes the portions of polysilicon layer 14 disposed beneath. This creates a self-aligned offset between the sidewall of trench 26 and the edge of nitride layer 16 which will serve as a mask for the formation of shallow dielectric isolation elements. If spacers 24 comprise nitride or oxynitride, they are not removed at this point and will later serve to minimize the lateral encroachment during shallow isolation element formation as will be explained presently.

Figure 7:
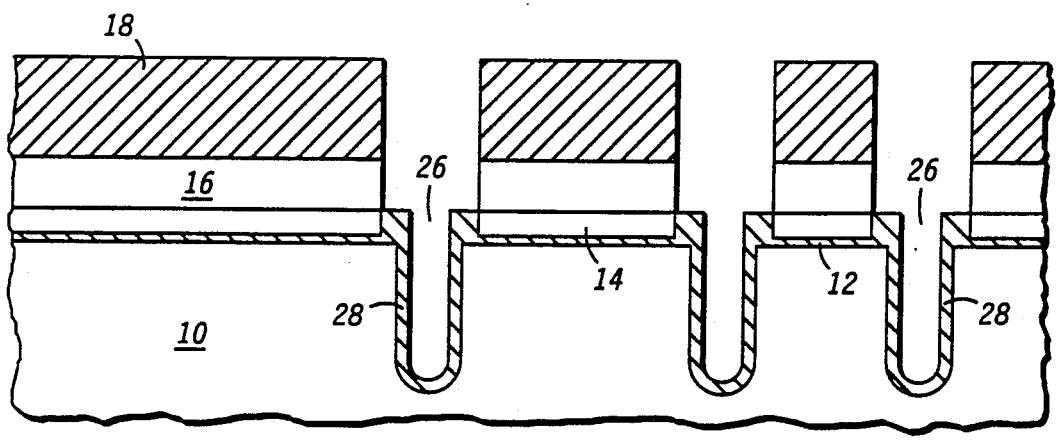
Figure 8:
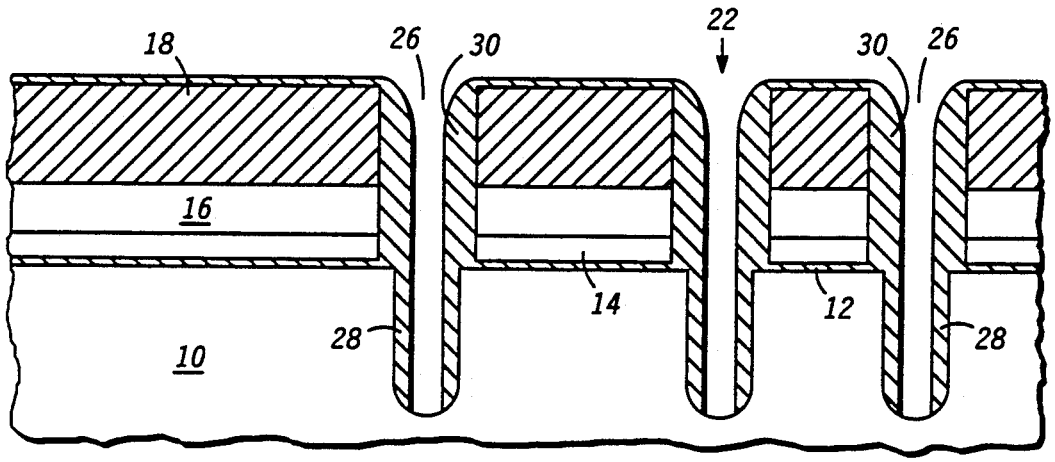

FIG. 7 illustrates the formation of a trench liner 28. In this embodiment, trench liner 28 is formed by thermally oxidizing the walls of trench 26. Following the formation of trench liner 28, dielectric material 30 is formed to add thickness to trench liner 28 as shown in FIG. 8.

If contact of trench fill material 32 (see FIG. 9) to substrate 10 is desired in the specific application for which the structure is to be employed, trench liner 28 may be removed from the bottom of trench 26. In this embodiment, trench liner 28 and material 30 are removed from the bottom of trench 26 by anisotropic reactive ion etching. Once trench liner 28 and material 30 have been removed from the bottom of trench 26, the optional implant of a channel stop (not shown) may be performed. Again, this is specific to the application for which the structure is being used.

Figure 9:
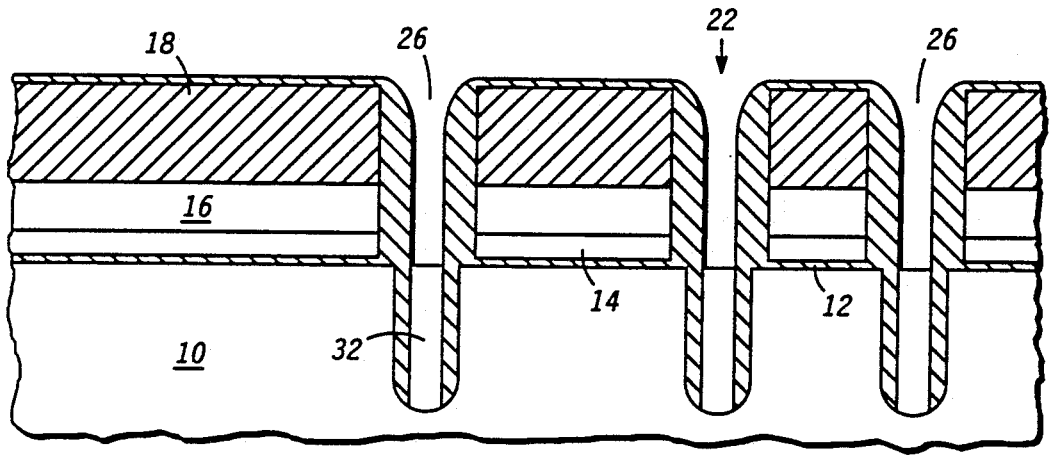
Figure 10:
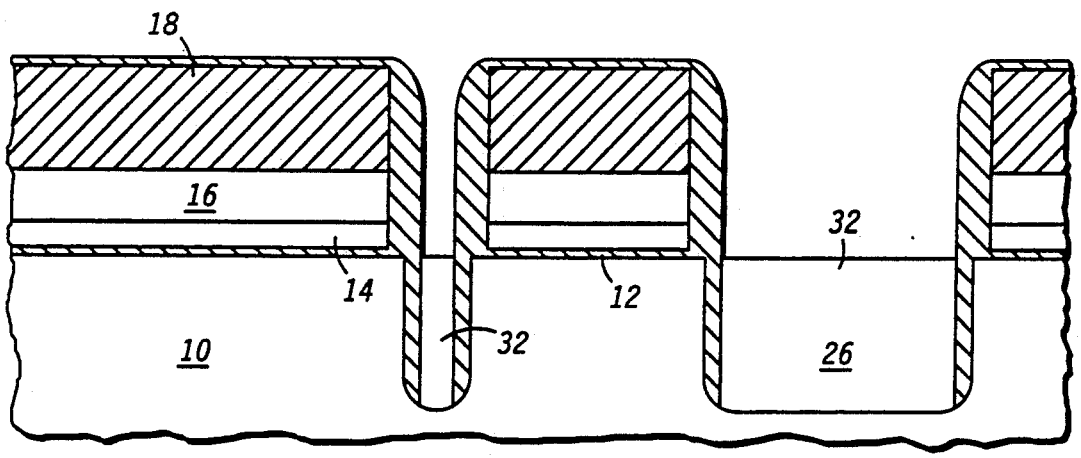

FIGS. 9 and 10 depict two different embodiments of the present invention wherein trenches 26 are filled with trench fill material 32. In these embodiments, trench fill material 32 comprises polysilicon which may be formed by LPCVD or selective polysilicon growth (SPG). If LPCVD is employed to form polysilicon trench fill 32, it might be necessary to employ a sacrificial material layer and an RIE planarization etchback so that trench fill material 32 is planarized. If SPG is employed, a planarization etchback will not be required. Preferably, the top of trench fill material 32 will be coplanar with the top surface of substrate 10.

Figure 11:
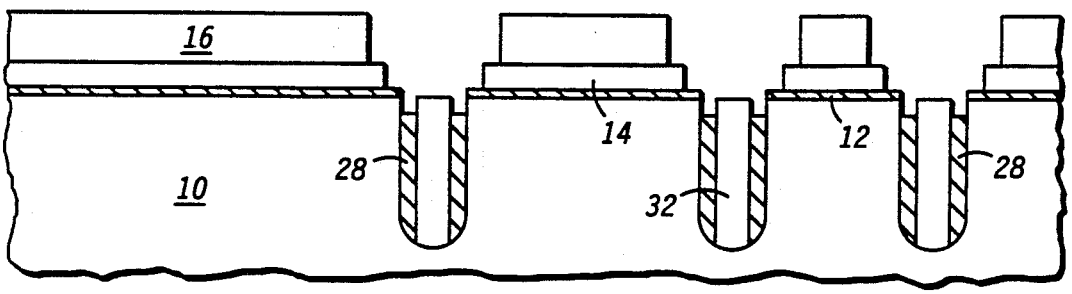

Following the formation of polysilicon trench fill 32 and the etchback planarization if necessary, oxide layer 18 is removed to expose nitride layer 16 as shown in FIG. 11. Oxide layer 18 is removed by a wet etch employing dilute hydrofluoric acid in this embodiment although reactive ion etching or various combinations of etches may be employed. In addition to removing oxide layer 18, this etch also removes the spacers resulting from the formation of material 30 that project above polysilicon layer 14 as well as a portion of trench liner 28. Again, it should be understood that if spacers 24 were comprised of oxide and not earlier removed, their removal may occur at this point.

Figure 12:
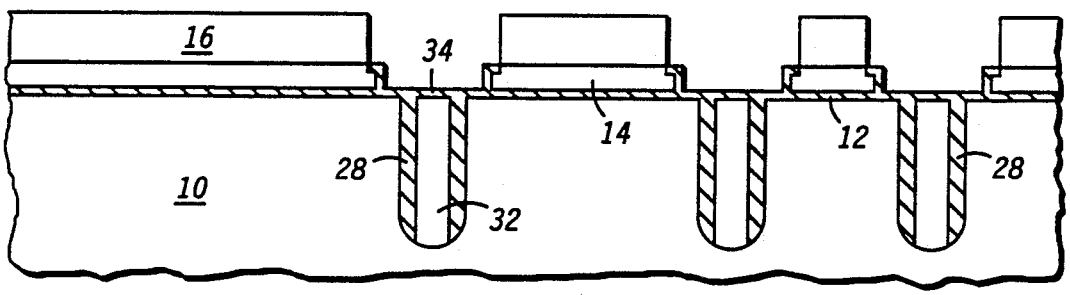

Once the oxide etch has taken place, a dielectric cap 34 comprised of oxide in this embodiment is formed on polysilicon trench fill 32 as shown in FIG. 12. Oxide cap 34 combines with trench liner 28 to essentially seal polysilicon trench fill material 32. Oxide cap 34 is formed by thermally oxidizing polysilicon trench fill 32 and must be thick enough to withstand unmasked reactive ion etching of nitride layer 16 as will be explained presently. Additionally, the exposed edges of polysilicon layer 14 will also be thermally oxidized. It should be understood that the formation of oxide cap 34 is not mandatory.

Figure 13:
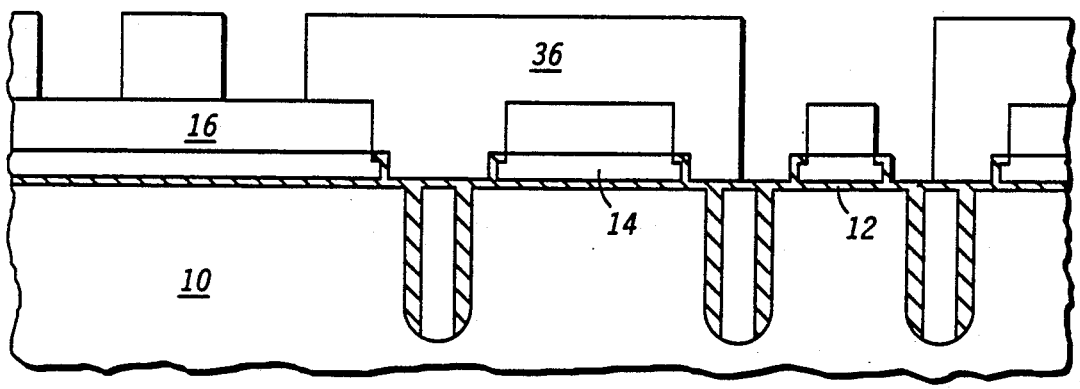
Figure 14:
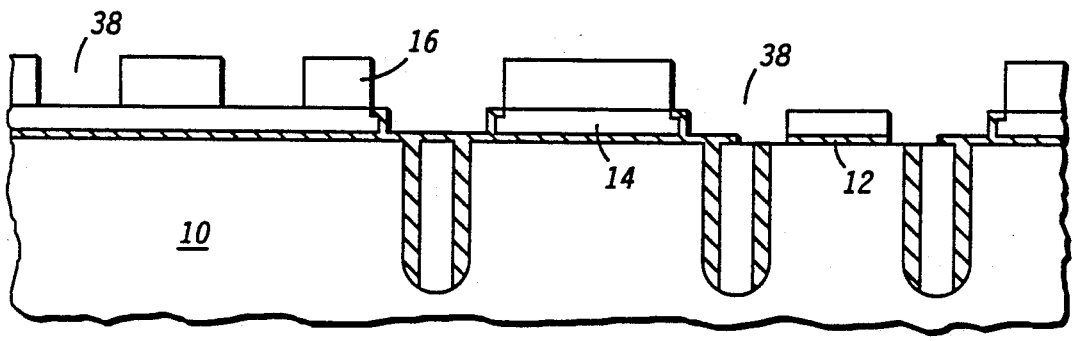

FIG. 13 illustrates the formation of a mask 36. This occurs by forming a photoresist layer on the structure and then patterning it by methods well known in the art. As shown in FIG. 14 openings 38 are formed in nitride layer 16 using mask 36. Once openings 38 have been formed by methods such as reactive ion etching, mask 36 is removed. One of skill in the art will understand that optional channel stops (not shown) may now be formed in substrate 10 beneath openings 38 by methods well known in the art. Openings 38 allow for the formation of shallow isolation elements that will be explained presently.

Figure 15:
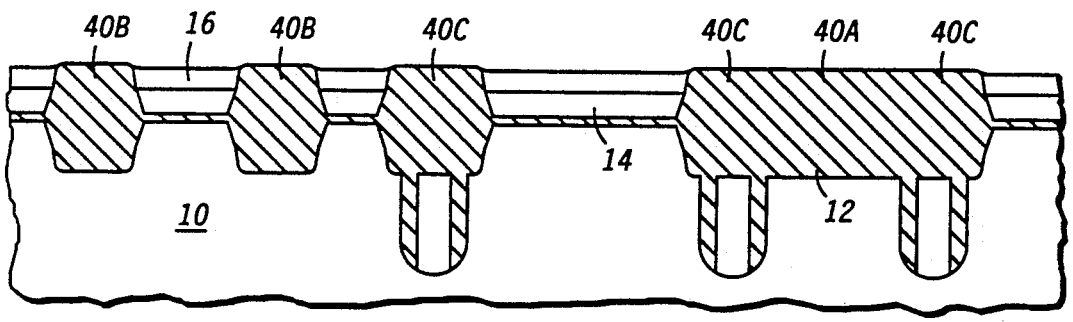
Figure 16:
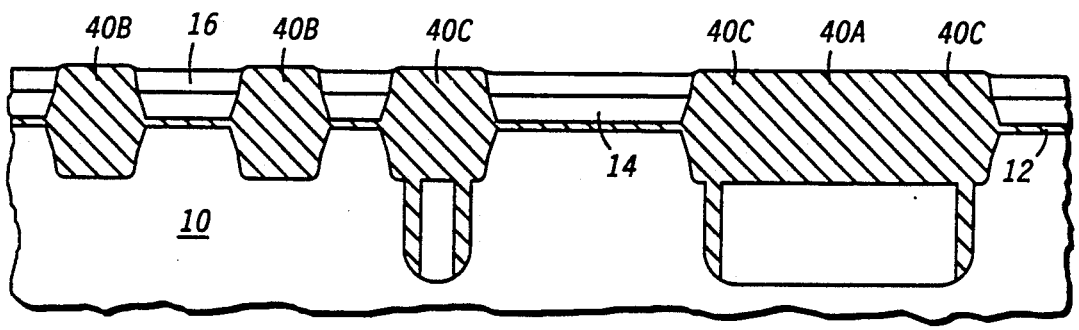

Once openings 38 have been formed, poly-buffered LOCOS oxidation occurs in openings 38 and also in the areas where nitride layer 16 was originally removed during the formation of openings 22 to form a series of shallow isolation elements 40. Shallow isolation elements such as 40A may be formed between multiple trenches or may be formed as separately defined shallow isolation elements 40B as shown in FIG. 15. It is also possible to form separate shallow isolation elements 40C over single trenches. FIG. 16 illustrates the formation of shallow isolation elements in the embodiment of the present invention having trenches of varying widths.

The encroachment into active areas by shallow isolation elements 40C formed over trench isolation elements is self-aligned to the edges of nitride layer 16 in openings 22 (see FIG. 2) defined by photoresist mask 20. This results in the encroachment requiring less proportional area and increases the scalability characteristics of the structure.

Figure 17:
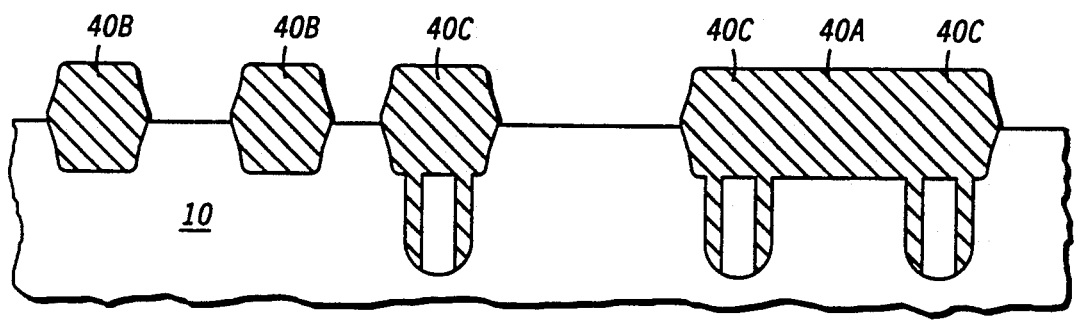
FIGS. 17-18 are highly enlarged cross-sectional views of a portion of a semiconductor structure prior to active device formation.
Figure 18:
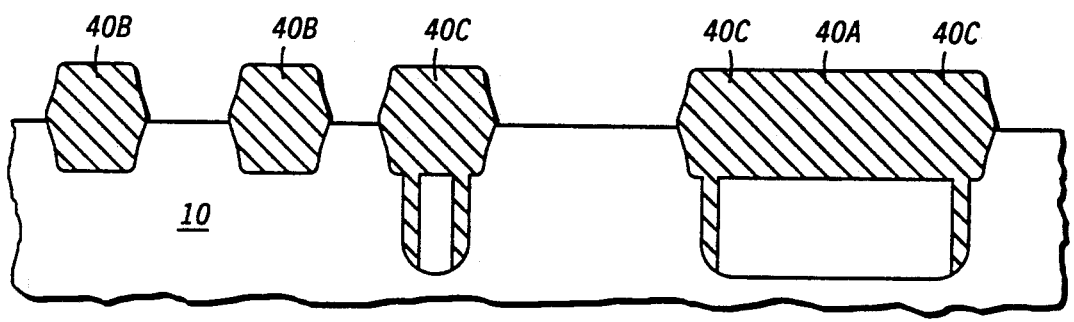

FIGS. 17–18 are highly enlarged cross-sectional views of two embodiments of a portion of a semiconductor structure prior to active device formation. Once shallow isolation elements 40 have been formed, an active area strip is performed. This strip includes using a wet etch to remove nitride layer 16, polysilicon layer 14 and thermal oxide layer 12 as well as other unwanted materials disposed on the active area.

It should be understood that the present invention may be compatible with multiple technologies and may be employed in high performance integrated circuits. In FIG. 17, the composite shallow isolation element 40 comprising 40A and 40C disposed over and between multiple trenches is ideally suited for bipolar inter-tub isolation while shallow isolation elements 40B are ideally suited for MOS intra-well and bipolar intra-tub isolation. Shallow isolation element 40C disposed over a single trench is ideally suited for densely packed bipolar active areas such as those employed in memory applications and CMOS inter-well isolation. In FIG. 18, shallow isolation elements 40C disposed over variable width trenches may be tailored depending upon the specific application for which they are intended. These variable width trenches allow for increased design flexibility.

To optimize CMOS inter-well isolation, mask 36 (see FIG. 13) may be employed to form shallow isolation elements disposed over and extending beyond the edges of single, variable width trenches. In a BIMOS application, this would create a misregistration between shallow isolation elements in the bipolar regions and those in the MOS regions.

Thus it is apparent there has been provided, in accordance with the invention, an improved method of fabricating a semiconductor structure which meets the objects and advantages set forth above. While specific embodiments of the present invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating a semiconductor structure comprising the steps of:
   providing a semiconductor substrate;
   forming a thermal oxide layer on said substrate;
   forming a polycrystalline semiconductor layer on said thermal oxide layer;
   forming a first dielectric layer on said polycrystalline semiconductor layer;
   forming a first mask on said first dielectric layer and using said first mask to form at least one opening in said first dielectric layer, said at least one opening extending to said polycrystalline semiconductor layer;
   forming dielectric spacers in said at least one opening;
   forming a trench in said substrate beneath said at least one opening, said dielectric spacers creating a self-aligned reduction in the width of said trench;
   forming a dielectric trench liner in said trench and in said at least one opening;
   filling said trench with polycrystalline semiconductor material; and
   forming a shallow dielectric isolation element on said filled trench.

2. The method of claim 1 wherein the first dielectric layer comprises:
   a nitride layer formed on the polycrystalline semiconductor layer; and
   an oxide layer formed on said nitride layer.

3. The method of claim 2 further comprising the step of removing the dielectric spacers to create a self-aligned offset between the sidewall of the trench and the edge of the nitride layer to serve as a mask for the formation of the shallow dielectric isolation element.

4. The method of claim 2 wherein a dielectric cap is formed on the polycrystalline trench fill and combines with the dielectric trench liner to seal said polycrystalline trench fill.

5. The method of claim 4 wherein the oxide layer is removed prior to the formation of the dielectric cap.

6. The method of claim 1 wherein the first dielectric layer, the polycrystalline semiconductor layer, and the thermal oxide layer are completely removed following the formation of the shallow dielectric isolation element.

7. The method of claim 3 wherein the forming a first mask step includes using said first mask to form a plurality of openings in said first dielectric layer, the forming dielectric spacers step includes forming dielectric spacers in one or more of said openings, the forming a trench step includes forming a plurality of trenches beneath said plurality of openings wherein the width of said plurality of trenches is limited by said dielectric spacers if said dielectric spacers are formed in said openings corresponding to said trenches and the forming a shallow dielectric isolation element step includes forming a shallow dielectric isolation element on one or more of said trenches.

8. The method of claim 7 wherein the plurality of trenches are of approximately the same width.

9. The method of claim 7 wherein the plurality of trenches are of varying widths.

10. A method of fabricating a semiconductor structure comprising the steps of:
    providing a semiconductor substrate;
    forming a thermal oxide layer on said substrate;
    forming a polysilicon layer on said thermal oxide layer;
    forming a nitride layer on said polysilicon layer;
    forming an oxide layer on said nitride layer;
    forming a first mask on said oxide layer and using said first mask to form a plurality of openings extending to said polysilicon layer;
    forming dielectric spacers in said plurality of openings;
    forming trenches in said substrate beneath said plurality of openings, said dielectric spacers creating a self-aligned reduction in the widths of said trenches;
    removing said dielectric spacers to expose said polysilicon layer and create a self-aligned offset between the sidewalls of said trenches and the edge of said nitride layer;
    forming a dielectric trench liner in said plurality of trenches;
    filling said plurality of trenches with polysilicon so that said polysilicon in said plurality of trenches is substantially planar with said substrate;
    removing said oxide layer so that said nitride layer is exposed;
    forming a second mask on said nitride layer and using said second mask to form isolation element openings in said nitride layer; and
    forming shallow oxide isolation elements in said isolation element openings and also in those areas where said nitride layer was removed during the formation of said plurality of openings, said self-aligned offsets serving to limit the encroachment of said shallow oxide isolation elements formed therebetween.

11. The method of claim 10 wherein the removing said dielectric spacers step may be performed at various times between the forming trenches step and subsequent to the forming shallow oxide isolation elements step.

12. The method of claim 10 wherein a dielectric cap is formed on the polysilicon trench fill and combines with the dielectric trench liner to seal said polysilicon trench fill.

13. The method of claim 10 wherein the nitride layer, the polysilicon layer and the thermal oxide layer are completely removed following the formation of the oxide isolation elements.

14. The method of claim 10 wherein the plurality of trenches are approximately the same width.

15. The method of claim 10 wherein the plurality of trenches are of varying widths.

16. The method of claim 10 wherein contact is made to the substrate through one or more of the polysilicon filled trenches.

* * * * *